(12) United States Patent
Malone et al.

(10) Patent No.: US 7,142,424 B2
(45) Date of Patent: Nov. 28, 2006

(54) HEAT EXCHANGER INCLUDING FLOW STRAIGHTENING FINS

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 184 days.

(21) Appl. No.: 10/835,852

(22) Filed: Apr. 29, 2004

(65) Prior Publication Data

US 2005/0243514 A1  Nov. 3, 2005

(51) Int. Cl.
*H05K 7/20* (2006.01)

(52) U.S. Cl. .................. 361/697; 361/687; 361/695; 361/700; 361/709; 165/121; 165/104.33; 165/41

(58) Field of Classification Search ............... 361/697
See application file for complete search history.

(56) References Cited

U.S. PATENT DOCUMENTS

| | | | | |
|---|---|---|---|---|
| 1,920,883 A | * | 8/1933 | Perkins | 123/41.49 |
| 4,909,311 A | * | 3/1990 | Nakamura et al. | 165/41 |
| 5,180,003 A | * | 1/1993 | Kouzel et al. | 165/121 |
| 5,765,630 A | * | 6/1998 | Bloomer | 165/121 |
| 5,957,194 A | | 9/1999 | Azar | |
| 5,986,882 A | * | 11/1999 | Ekrot et al. | 361/687 |
| 6,029,742 A | | 2/2000 | Burward-Hoy | |
| 6,161,610 A | | 12/2000 | Azar | |
| 6,234,239 B1 | | 5/2001 | Azar | |
| 6,263,955 B1 | | 7/2001 | Azar | |
| 6,269,002 B1 | | 7/2001 | Azar | |
| 6,407,918 B1 | * | 6/2002 | Edmunds et al. | 361/695 |
| 6,453,711 B1 | | 9/2002 | Rhodes et al. | |
| 6,460,353 B1 | | 10/2002 | Udobot et al. | |
| 6,501,654 B1 | | 12/2002 | O'Connor et al. | |
| 6,581,394 B1 | | 6/2003 | Smolenskiy | |
| 6,588,498 B1 | * | 7/2003 | Reyzin et al. | 165/104.33 |
| 6,639,797 B1 | | 10/2003 | Saeki et al. | |
| 6,654,247 B1 | * | 11/2003 | Lee | 361/697 |
| 6,671,172 B1 | * | 12/2003 | Carter et al. | 361/697 |
| 6,920,045 B1 | * | 7/2005 | Huang et al. | 361/700 |
| 6,967,845 B1 | * | 11/2005 | Chiang et al. | 361/709 |

FOREIGN PATENT DOCUMENTS

| | | |
|---|---|---|
| GB | 2143631 A | 7/1984 |
| JP | 58018091 A | 2/1983 |
| JP | 08125369 A | 5/1996 |
| SU | 964422 A2 | 10/1982 |
| SU | 1828537 A3 | 7/1993 |

* cited by examiner

*Primary Examiner*—Michael Datskovskiy (57) ABSTRACT

A heat exchanger includes a tube, and a plurality of fins coupled to the tube having a curved fan-stator shape that facilitates straightening of airflow from a fan.

23 Claims, 13 Drawing Sheets

HEAT EXCHANGER INCLUDING FLOW STRAIGHTENING FINS

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

As electronic components and subsystems evolve to increasing capability, performance, and higher power, while reducing size and form factor, efficient and cost-effective removal of excess heat is desired. Among available thermal management solutions, liquid cooling via cold plate technology offers high capacity for heat rejection and movement of heat from internal sources to external ambient air. Liquid cooling loop systems typically cycle pumped coolants continuously, conveying excess heat from heat-generating devices. The heat is dispersed into ambient air using a heat exchanger or other device.

SUMMARY

In accordance with an embodiment of an electronic liquid cooling system, a heat exchanger includes a tube, and a plurality of fins coupled to the tube having a curved fan-stator shape that facilitates straightening of airflow from a fan.

BRIEF DESCRIPTION OF THE DRAWINGS

Embodiments of the invention relating to both structure and method of operation, may best be understood by referring to the following description and accompanying drawings.

DETAILED DESCRIPTION

Compact electronic devices and systems, such as server architectures, may use a liquid loop cooling solution to accommodate increasing power and power density levels for microprocessors and associated electronics. Liquid loops can use a pump to drive cooling fluid through high pressure-drop channels of the colds plates attached to processors and other high-power components and along potentially long and narrow-diameter tube completing the loop between the cold plate, condenser, and pump. Heat is removed from the loop by forced-air convection at the heat exchanger.

Various embodiments of a disclosed electronic system and liquid loop cooling system describe a heat exchanger with fins configured to straighten airflow for optimized fan performance. The heat exchanger and fins can further be configured for acoustic noise reduction.

Figure 1:
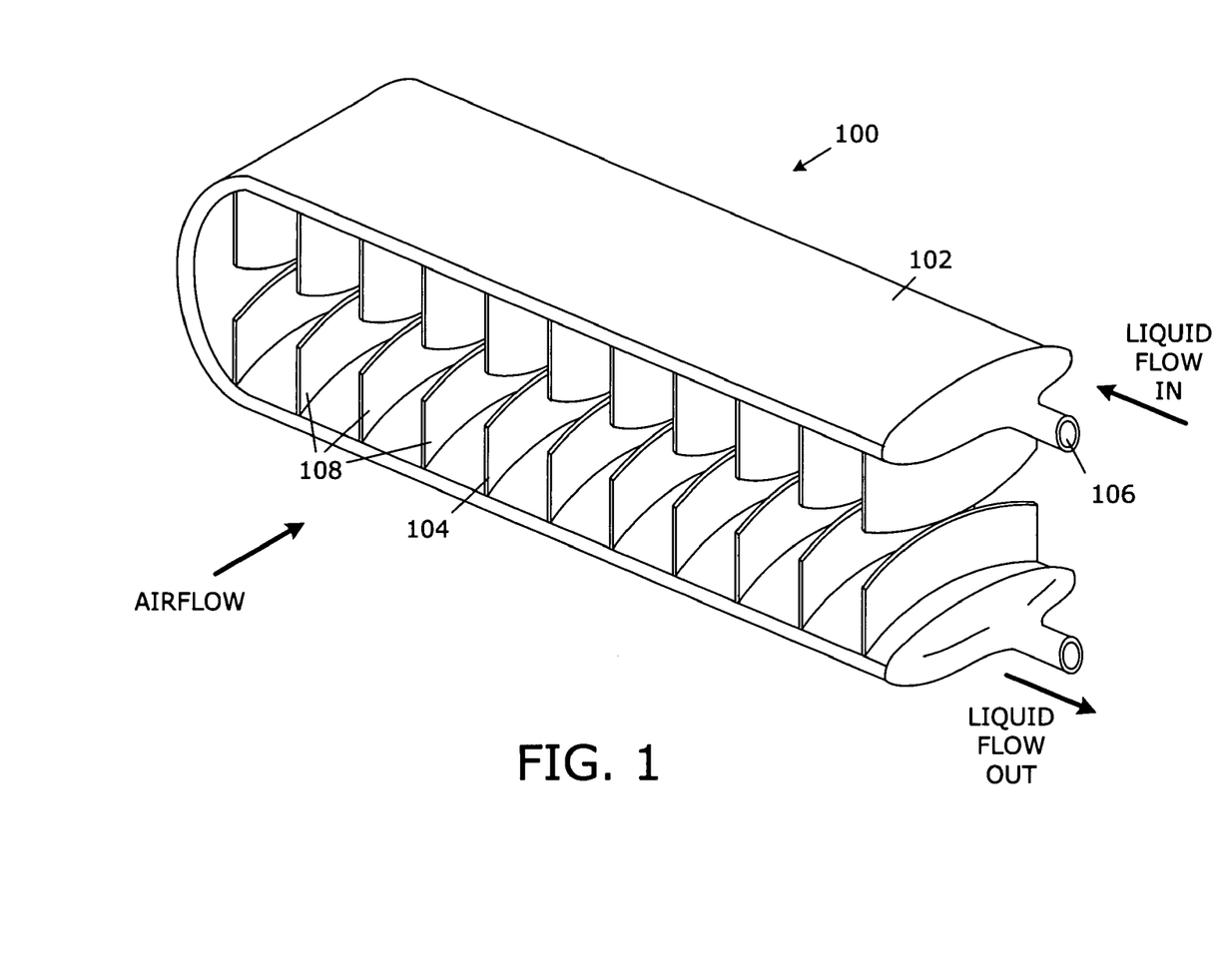
FIG. 1 is a perspective pictorial drawing illustrating an embodiment of a heat exchanger having fins with a curved fan-stator shape that facilitates straightening of airflow from a fan.

Referring to FIG. 1, a perspective pictorial drawing illustrates an embodiment of a heat exchanger 100 that includes a tube 102, and a plurality of fins 104 coupled to the tube 102. The fins 104 have a curved fan-stator shape that facilitates straightening of airflow from a fan. An interior bore 106 is enclosed within the tube 102 and can contain and circulate a cooling fluid into and out from the heat exchanger 100. The heat exchanger 100 includes fins 104 attached to the tube 102 that contains cooling fluid. The tube 102 may pass through the fin bank one or many times and may pass in various orientations to attain improved or optimized cooling performance. In a compact server, the cooling air may be driven across the heat exchanger 100 using common tube-axial or blower fans in close proximity to the heat exchanger fins 104.

Curvature of the fins 104 can have a form selected to accept and straighten a vector of air leaving an axial flow fan. Curvature straightens the air into alignment with the axis of the fans. In some embodiments, curvature of the fins 104 is selected to vary in correspondence with radial distance from a central axis of an axial flow fan.

The plurality of fins 104 can be arranged in a stack of mutually parallel, closely-spaced curved plates 108.

The fins 104 can be bent or otherwise formed into the curved shape, generally prior to attachment to the tube 102.

Figure 2:
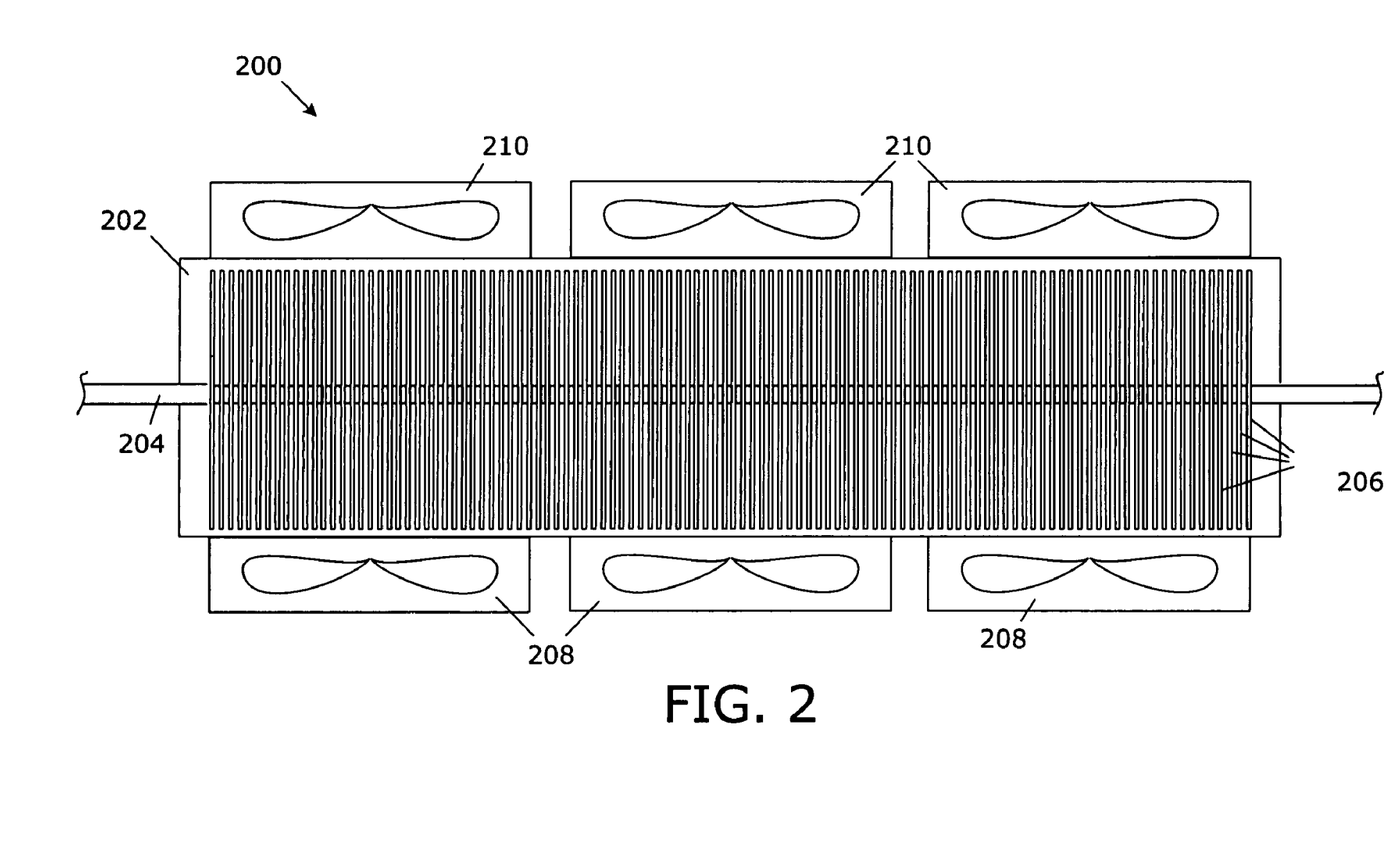
FIG. 2 is a schematic pictorial diagram showing a top view of an embodiment of an assembly for usage in a cooling system.

Referring to FIG. 2, a schematic pictorial diagram illustrates a top view of an embodiment of an assembly 200 for usage in a cooling system. The assembly 200 includes a heat exchanger 202 constructed as a tube 204 and a plurality of fins 206 coupled to the tube 204. The fins 206 define airflow channels between adjacent fins 206. The assembly further includes opposing fans 208, 210 coupled to and abutting opposite sides of the heat exchanger 202. The opposing fans 208, 210 generate an airflow direction aligned with the fins 206. The tube 204 encloses an interior bore within which a cooling fluid can circulate. The illustrative assembly 200 includes redundant fans 208, 210 that are useful, for example, for server cooling solutions.

The assembly 200 depicts an example arrangement of the heat exchanger 202 and cooling fans 208, 210 including redundant fans arranged on either side of the heat exchanger 202. In the illustrative arrangement, the heat exchanger fins 206 are planar and aligned with airflow direction. The heat exchanger and fan arrangement improves performance in at least two aspects, acoustical noise reduction and flow straightening.

Fans positioned in close proximity often generate annoying tones. Noise avoidance can be difficult in modern computer systems due to a strong market preference for system compaction, for example leading to reduction in computer chassis dimensions. Positioning of the fans 208, 210 on either side of the heat exchanger 202 attains a desired separation without wasting space. Accordingly, multiple pairs of opposing fans 208, 210 can be connected to opposing sides of the heat exchanger 202 with the fans 208, 210 abutting opposite sides of the heat exchanger 202. In some arrangements, the thickness of the heat exchanger 202 and separation of the opposing fans 208, 210 is selected to reduce acoustical noise.

Air exiting a typical tube-axial fan has a significant radial component. If fans are arranged in series for redundancy, downstream fan performance can be significantly impacted because air entering the downstream fan receives airflow with an off-axis directional component. The effect can be mitigated by separating the fans by a significant distance, although at the cost of potential system compaction or size reduction. By placing the fans 208, 210 on either side of the heat exchanger 202, fins 206 straighten the airflow, thereby improving performance of the downstream fan 210. Straight fins at any suitable orientation attain performance improvement. Accordingly, the fins 206 are formed into a shape that facilitates straightening of airflow from an upstream fan 208 and improves performance of a downstream fan 210. For example, curvature of the fins 206 can have a form selected to accept and straighten a vector of air leaving an axial flow fan.

Figure 3A:
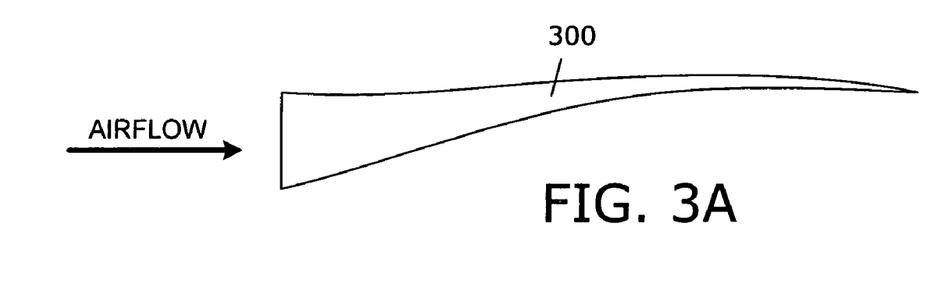
FIGS. 3A and 3B are schematic pictorial diagrams illustrating top and side views, respectively, of an embodiment of a fin that is formed with a curved fan-stator shape.
Figure 3B:
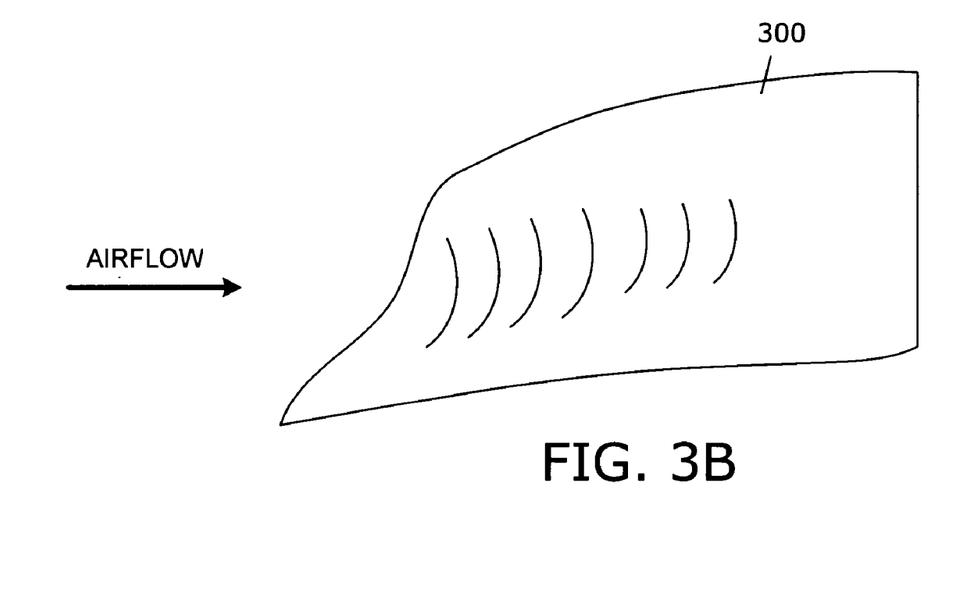

Additional enhancement in fan performance can be attained by usage of curved fins in the heat exchanger. A fin can be shaped to attain stator functionality. Referring to FIGS. 3A and 3B, schematic pictorial diagrams illustrate top and side views, respectively, of an embodiment of a fin 300 that is formed with a curved fan-stator shape that facilitates straightening of airflow from an upstream fan of the opposing fans. The fin 300 shape has a double bend to adjust and straighten airflow from a fan. Air from the fan exits at different angles at different elevations of the fan cross-section. For example, air exits at different angles at upper and lower levels of the fan.

Figure 4:
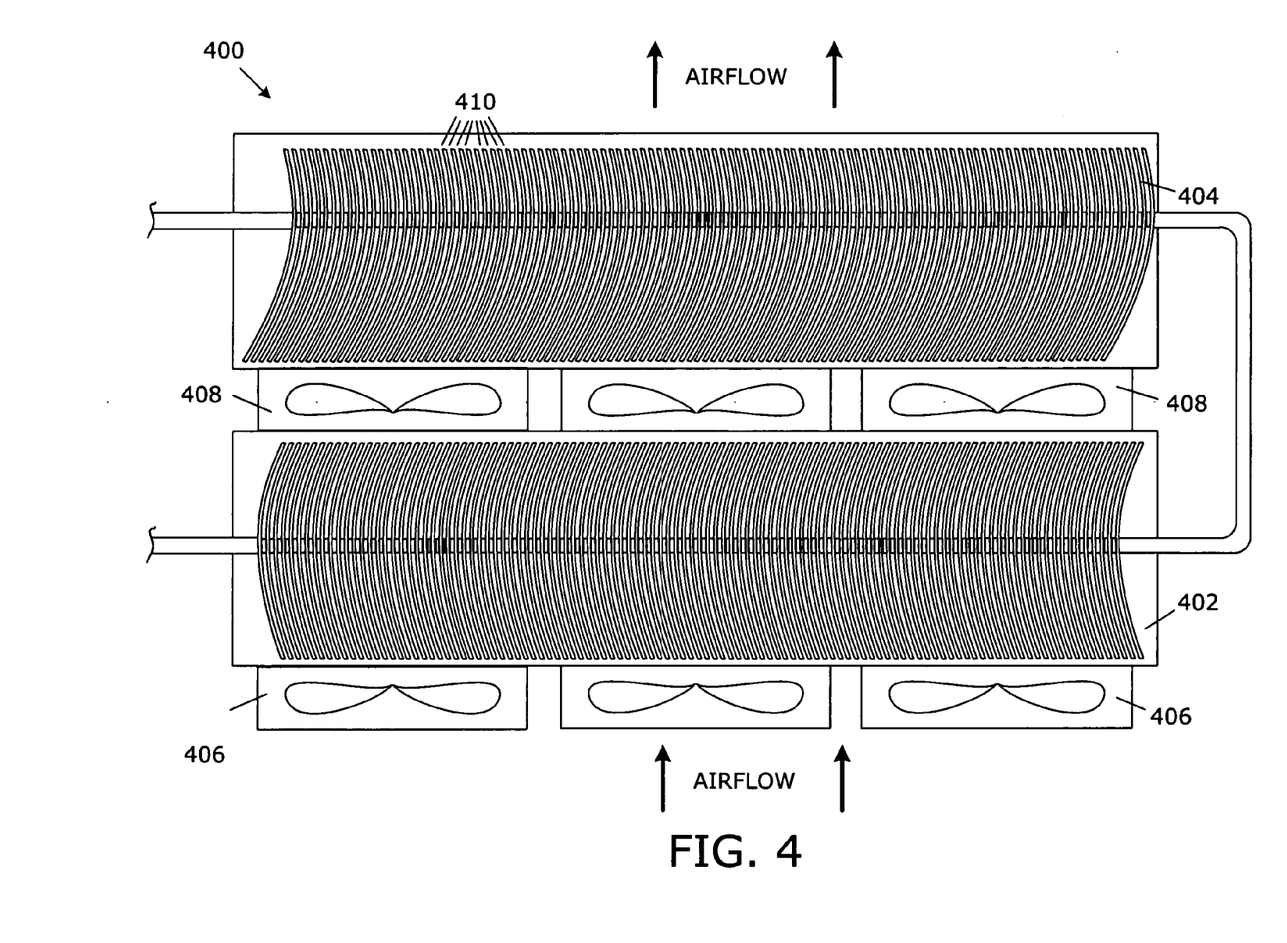
FIG. 4 is a schematic pictorial diagram showing an overhead view of an embodiment of a cooling assembly that includes opposing heat exchangers.

A further usage of curved heat exchanger fins enables alignment of airflow directly to downstream components. In some embodiments, downstream fans can be positioned between two banks of curved fins, causing air exiting the heat exchanger to be aligned with the fan axis. Eliminating a radial airflow vector component results in increased cooling of downstream components because airflow can be directed to specific locations, for example to particular heat-generating components. Referring to FIG. 4, a schematic pictorial diagram illustrates an overhead view of an embodiment of a cooling assembly 400 that includes opposing heat exchangers 402 and 404 coupled to and abutting opposite sides of a downstream fan 408 of opposing fans 406 and 408. The opposing heat exchangers 402 and 404 each have a plurality of fins 410 in a configuration that facilitates straightening of airflow through the downstream fan 408 and to components downstream of the assembly 400. In the illustrative cooling assembly 400, downstream fans 408 are placed between two banks of curved fins 410. The curved fins 410 of the downstream heat exchanger 404 align exiting airflow with the fan axis to most effectively cool components downstream of the assembly 400.

Figure 5A:
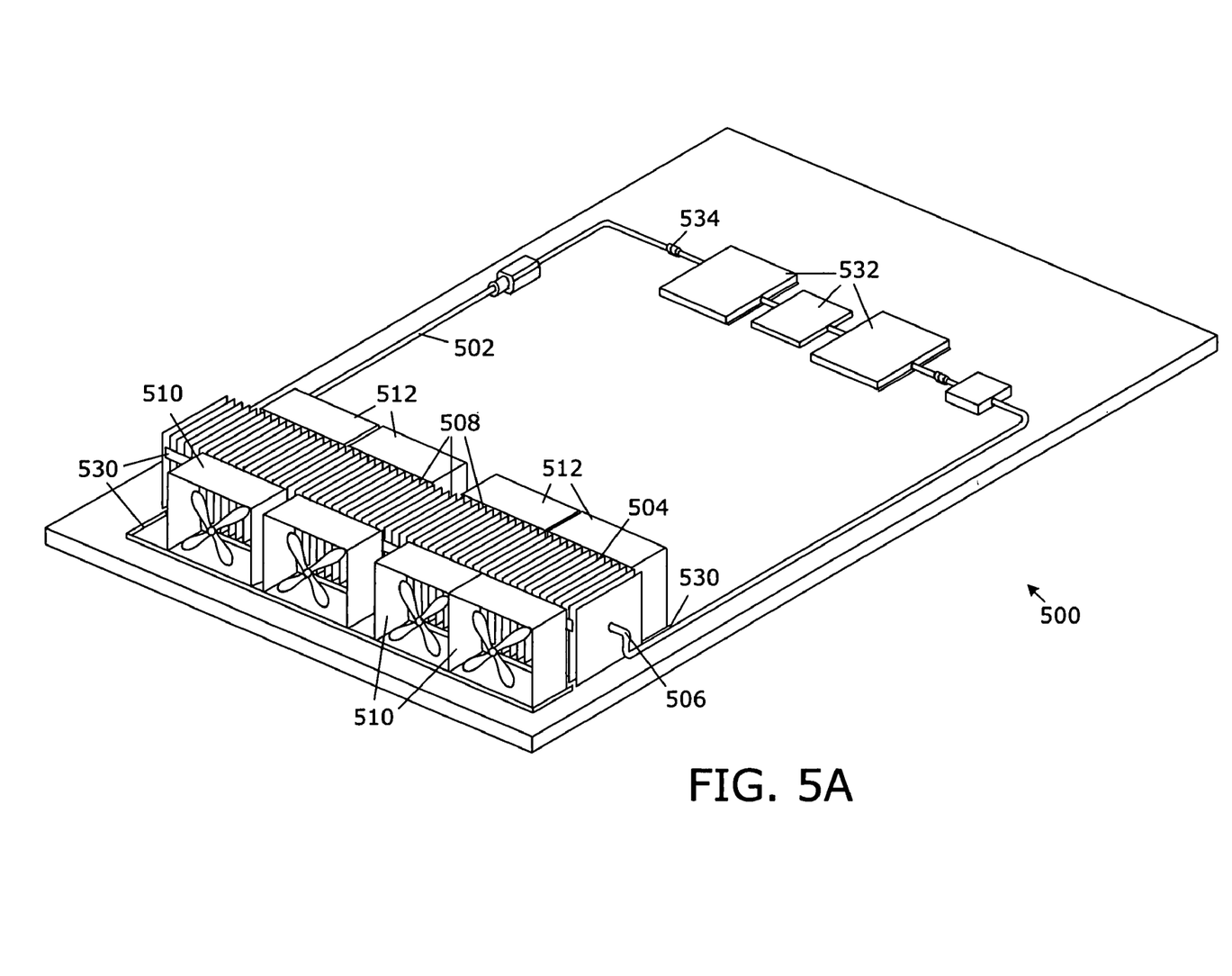
FIGS. 5A and 5B depict perspective pictorial diagrams illustrating embodiments of liquid loop cooling systems that utilize airflow straightening.

Referring to FIG. 5A, a perspective pictorial diagram illustrates an embodiment of a liquid loop cooling system 500 that includes a tubing 502 enclosing an interior bore or lumen within which a cooling fluid can circulate, and a heat exchanger 504 coupled to the tubing 502. The heat exchanger 504 includes a tube 506 and a plurality of fins 508 coupled to the tube 506 that define airflow channels between adjacent fins 508. The liquid loop cooling system 500 further includes opposing fans 510 and 512 coupled to and abutting opposite sides of the heat exchanger 504. The opposing fans 510 and 512 generate an airflow direction aligned with the fins 508.

The width of the heat exchanger 504 determines the separation between the opposing fans 510 and 512. Fans can generate annoying noises if positioned in too close proximity. The width can be selected to separate the fans sufficiently to reduce acoustical noise. Positioning the fans 510 and 512 on opposing sides of the heat exchanger 504 attains a desired separation without wasting space interior to an electronic system.

The illustrative liquid loop cooling system 500 has multiple fans 510 and multiple fans 512 coupled to and abutting each of the opposing sides of the heat exchanger 504. The number of fans on each of the two sides of the heat exchanger 504 is selected in various designs. For example, some arrangements may include only a single fan 510 and a single fan 512. Typically the fans 510 and 512 have similar or identical sizes and geometry, although in some configurations the sizes and geometry may be different among the multiple fans.

The liquid loop cooling system 500 may further include mounts 530 capable of holding the fans 510, 512, a plurality of cold plates 532 coupled to the tubing 502 and capable of addition and removal via quick disconnect connectors 534. A typical example of a cold plate 532 is a flat metal plate with a series of channels on one or both sides. A length of serpentine tubing can be secured within the channels to contain the liquid coolant flows. Fittings at the inlet and outlet of the tubing connect to the tubing 502. Common tubing materials are copper and stainless steel. Components may be mounted on one or both sides of a cold plate 532.

Figure 5B:
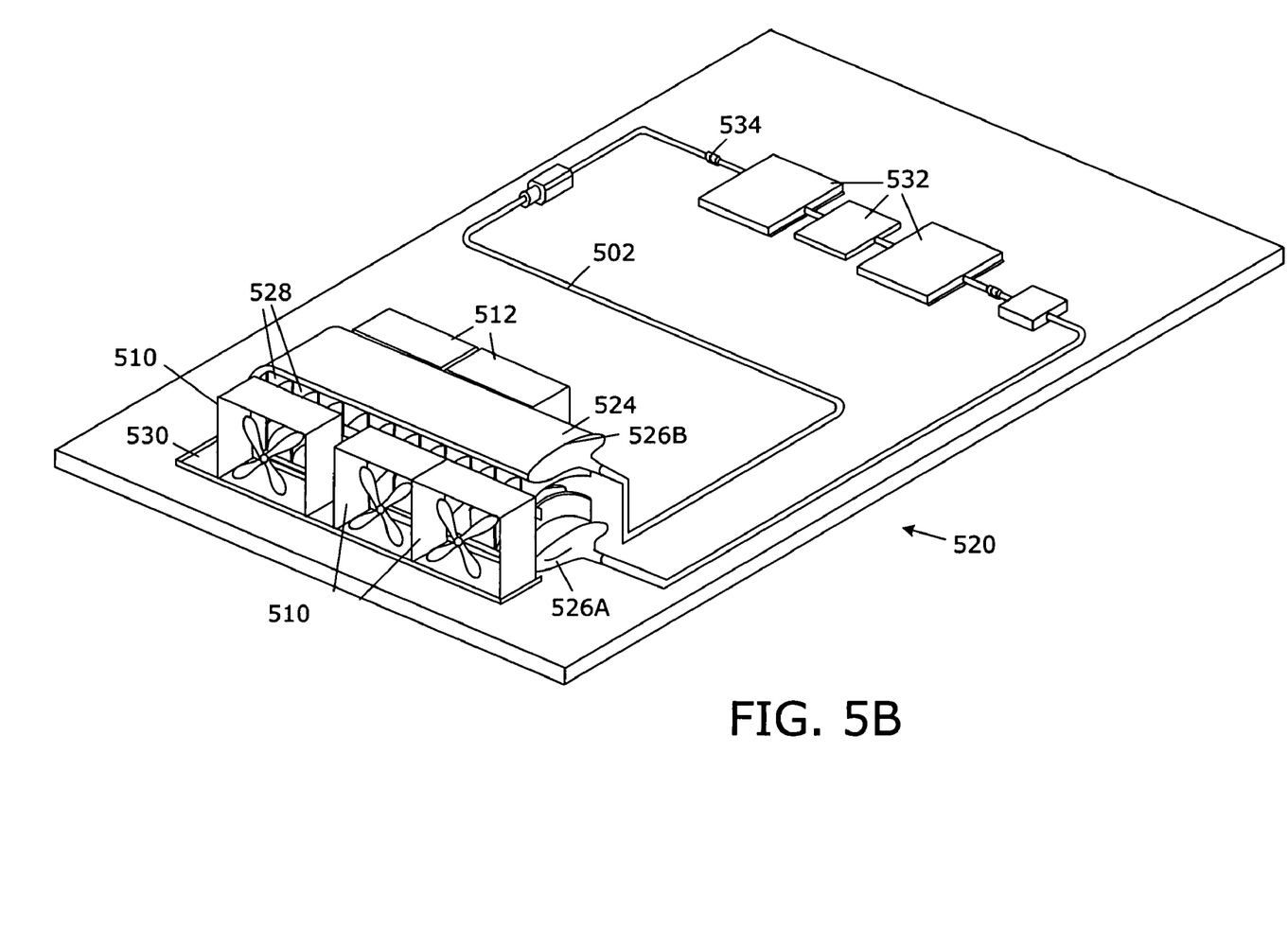

Referring to FIG. 5B, a perspective pictorial diagram illustrates an alternative embodiment of a liquid loop cooling system 520 that includes an alternative type, multiple-pass heat exchanger 524. The multiple-pass heat exchanger 524 includes a tube having a longitudinal axis and a flattened cross-section forming substantially parallel tube segments 526A and 526B. The heat exchanger 524 has multiple fins 528 coupled to the flattened cross-section tube segments 526A, 526B. The fins 526A and 526B of adjacent flattened cross-section tube segments are separated by a gap.

The illustrative dual-pass liquid-to-air heat exchanger 524 has the form of a flattened tube 526A, 526B for carrying a cooling liquid with fins 528 soldered or braised to the tube. In the illustrative embodiment, two separate sets of fins are used, one attached to a first tube segment and a second attached to a second tube segment. The flattened-tube heat exchanger 524 enables a large variety of arrangements, sizes, and configurations, simply by selecting the sizes, geometry, and topology of fins and tube.

Figure 6:
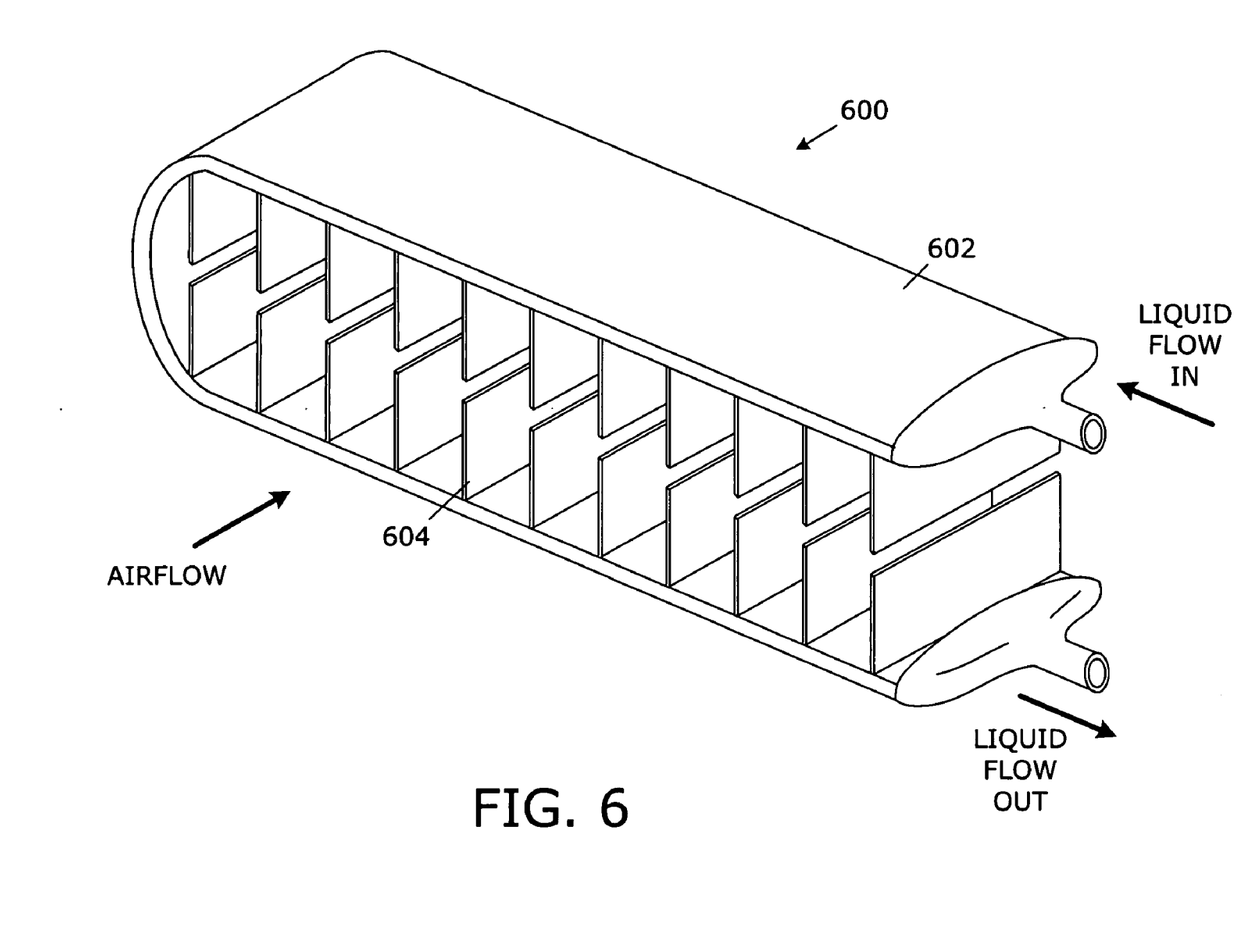
FIG. 6 is a perspective pictorial drawing illustrating an embodiment of a heat exchanger having fins with a straight shape with capability to straighten airflow from a fan.

In some embodiments, the heat exchanger 524 can have the form depicted in FIG. 6, a perspective pictorial diagram showing a heat exchanger 600 with a flattened tube 602 and multiple straight fins 604 connected to the flattened tube 602.

Airflow through a heat exchanger can be improved using a heat exchanger 100 of the type shown in FIG. 1 in which the fins 508, 528 are selected to have a curvature of a form selected to accept and straighten a vector of air leaving an axial flow fan. For example, the fins 508, 528 can have a curved fan-stator shape that facilitates straightening of airflow from an upstream fan of the opposing fans.

Figure 7A:
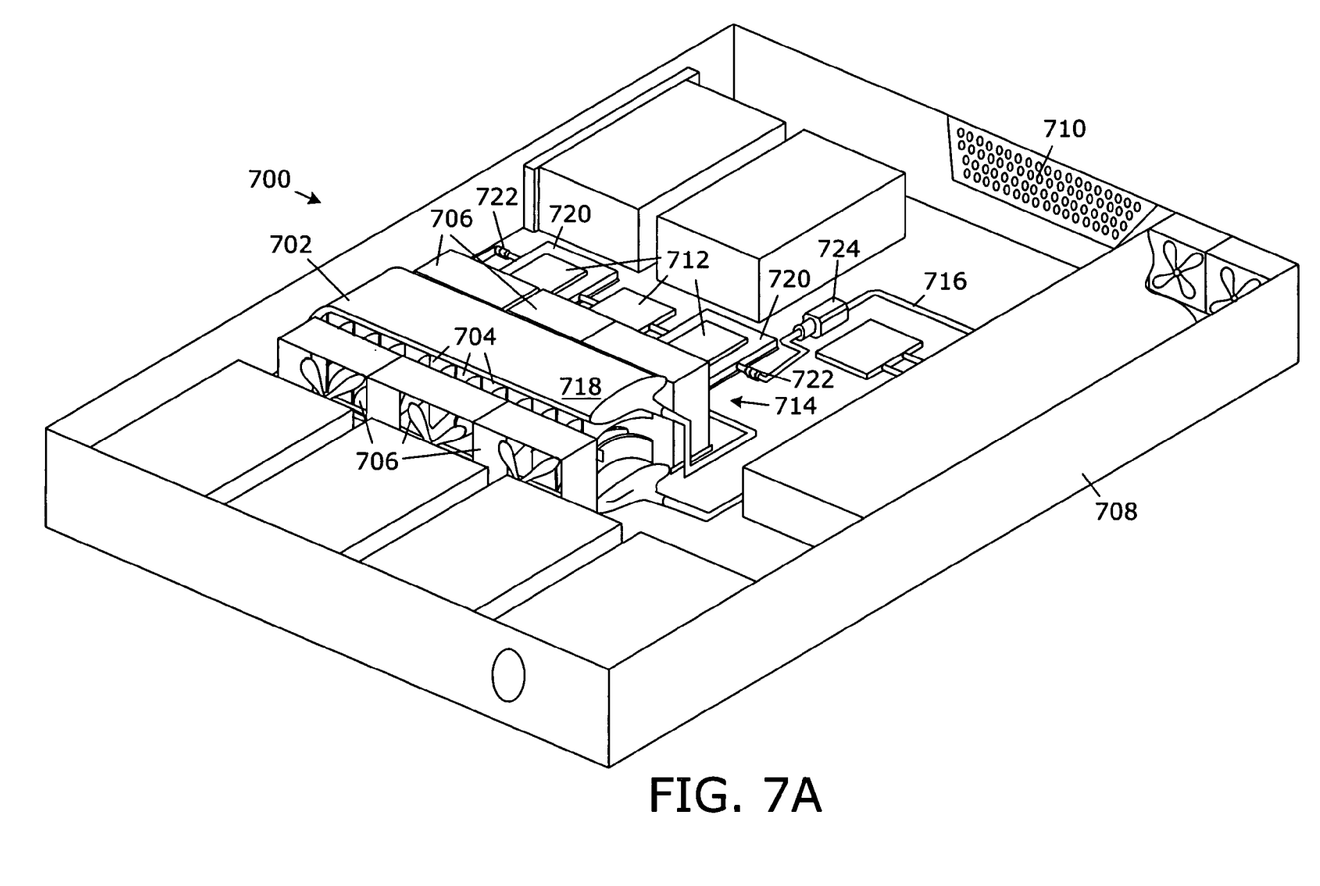
FIGS. 7A and 7B are a perspective pictorial diagram and an overhead pictorial view diagram respectively illustrating an embodiment of an electronic system, such as a computer server, that includes a liquid loop cooling system implanting airflow straightening.
Figure 7B:
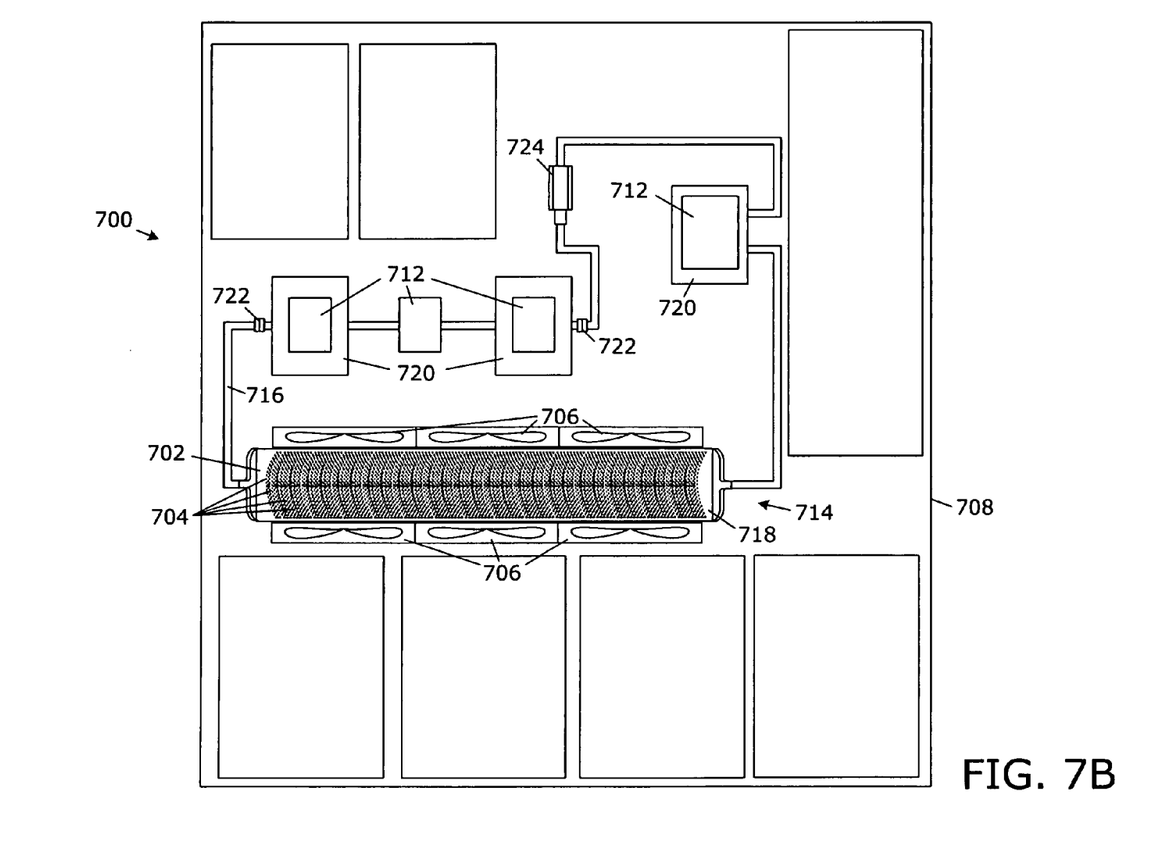

Referring to FIGS. 7A and 7B, a perspective pictorial diagram and an overhead pictorial view diagram respectively illustrate an embodiment of an electronic system 700, such as a computer server. The electronic system 700 includes a heat exchanger 702 with fins 704 capable of straightening airflow from one or more fans 706. The electronic system 700 further includes a chassis 708 including airflow inlet and outlet vents 710, a plurality of components 712 including heat-generating components mounted within the chassis 708, and a liquid loop cooling system 714. The liquid loop cooling system 714 includes a tubing 716 enclosing an interior bore or lumen within which a cooling fluid can circulate, the heat exchanger 702, and fans 706. The heat exchanger 702 is coupled to the tubing 716 and includes a tube 718 and a plurality of fins 704 coupled to the tube 718 that define airflow channels between adjacent fins 704. The fans 706 are positioned on opposing sides of the heat exchanger 702 and generate an airflow direction aligned with the multiple fins 704.

Various electronic system embodiments may utilize a single pair of opposing fans 706 or multiple associated fan pairs on the opposite sides of the heat exchanger 702. In various embodiments, the electronic system 700 may be configured with a heat exchanger and associated fins on only one side of the downstream fans as shown in FIGS. 7A and 7B, or may include heat exchangers on opposing sides of the downstream fans to assist straightening of airflow through the downstream fan and to components 712 downstream of the assembly.

The illustrative electronic system 700 includes a heat exchanger 702 with multiple fins 704 having a curved fan-stator shape that facilitates straightening of airflow from an upstream fan of the opposing fans 706. The curved fins 704 have a shape that can be selected to deflect air flow from the fans 706 most appropriately to straighten the airflow vector received from the fans 706, thereby producing an increased or optimum cooling of components 712 downstream of the liquid loop cooling system 714. In other embodiments, the straight fins can be used to also improve cooling performance although the improvement is generally not as pronounced as the curved-fin system.

The liquid loop cooling system 714 may further includes a plurality of cold plates 720 coupled to the tubing 716 and capable of addition and removal via quick disconnect connectors 722. A typical example of a cold plate 720 is a flat metal plate with a series of channels on one or both sides. A length of serpentine tubing can be secured within the channels to contain the liquid coolant flows. Fittings at the inlet and outlet of the tubing connect to the tubing 716. Common tubing materials are copper and stainless steel. Components may be mounted on one or both sides of a cold plate 720.

The liquid loop cooling system 714 also may include a pump 724 to drive cooling fluid through high pressure-drop channels of the cold plates 720 attached to processors and other high-power components 712 and along potentially long and narrow-diameter tube completing the loop between the cold plate 720, heat exchanger 702, and pump 724. Heat is removed from the loop by forced-air convection at the heat exchanger 702.

Cross-sectional thickness of the heat exchanger 702 can be selected to separate fans 706 on opposing sides of the heat exchanger 702 by a distance that reduces acoustical noise.

The illustrative electronic system 700 and liquid loop cooling system 714 can be configured to direct airflow through the heat exchanger 702 by determining a spatial vector distribution of airflow produced by an axial flow fan 706 and deriving a fin plate shape and configuration for the multiple heat exchanger fins 704 based on the spatial vector distribution that straightens the airflow from the fan 706.

Figure 7C:
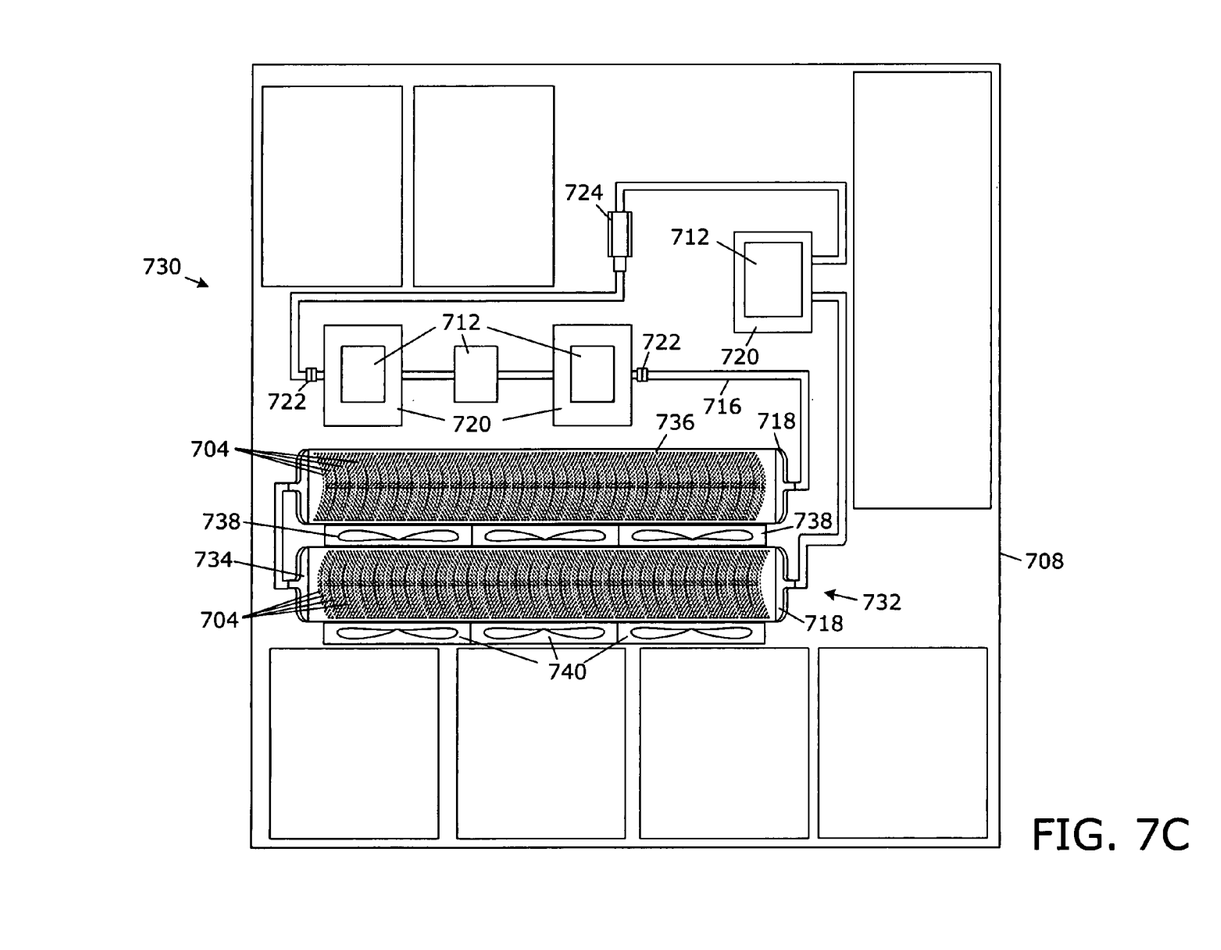
FIG. 7C shows an alternative embodiment of an electronic system with a cooling assembly that includes dual opposing heat exchangers.

FIG. 7C shows an alternative embodiment of an electronic system 730 including a liquid loop cooling assembly 732 with opposing heat exchangers 734 and 736 coupled to and abutting opposite sides of a downstream fan 738 of opposing fans 738 and 740.

Figure 8:
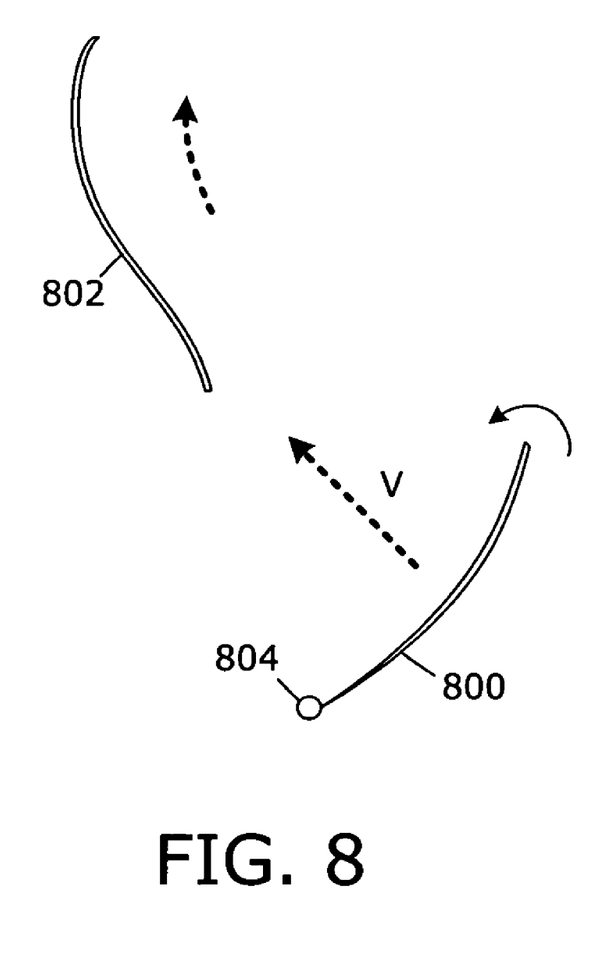
FIG. 8 is a schematic pictorial diagram showing an overhead view of a fan-stator arrangement and operation of airflow straightening.

Fins 704 of the heat exchanger 702 may be curved in the manner of a fan stator to enhance fan performance. Referring to FIG. 8, a schematic pictorial diagram illustrates functionality of a stator using an overhead view of a fan-stator arrangement formed by a fan blade 800 and a stator 802, or stationary blade, formed by a curved fin. The moving fan blade 800 rotates about an axis 804 and produces airflow moving from the fan in the direction of a vector V. Fins of a heat exchanger can have a curved shape of a stator 802 with a curvature based on the shape and size of the fan blade 800 to optimize or improve straightening of airflow leaving the heat exchanger. The improvement in functionality is attained using an existing design element, the heat exchanger fins, and without impact to space requirements.

Various shaped fins can be used to straighten airflow from the fans, for example the straight fins illustrated in FIG. 6 and the curved fins shown in FIG. 1. Many criteria can be used to select fan shape including airflow straightening efficiency and other performance measures, balanced against manufacturing costs and capabilities.

Referring again to FIGS. 7A and 7B, configuration of the illustrative electronic system 700 and liquid loop cooling system 714 further includes arranging the plurality of heat exchanger fins 704 on the heat exchanger 702 according to the derived fin plate shape and configuration.

In some systems, opposing axial flow fans 706 can be positioned abutting the opposite upstream and downstream sides of the heat exchanger 702.

In some embodiments, an additional downstream heat exchanger can be interposed between the liquid loop cooling system 714 and downstream components 712, abutting a downstream side of the downstream axial flow fans 706.

Figure 9A:
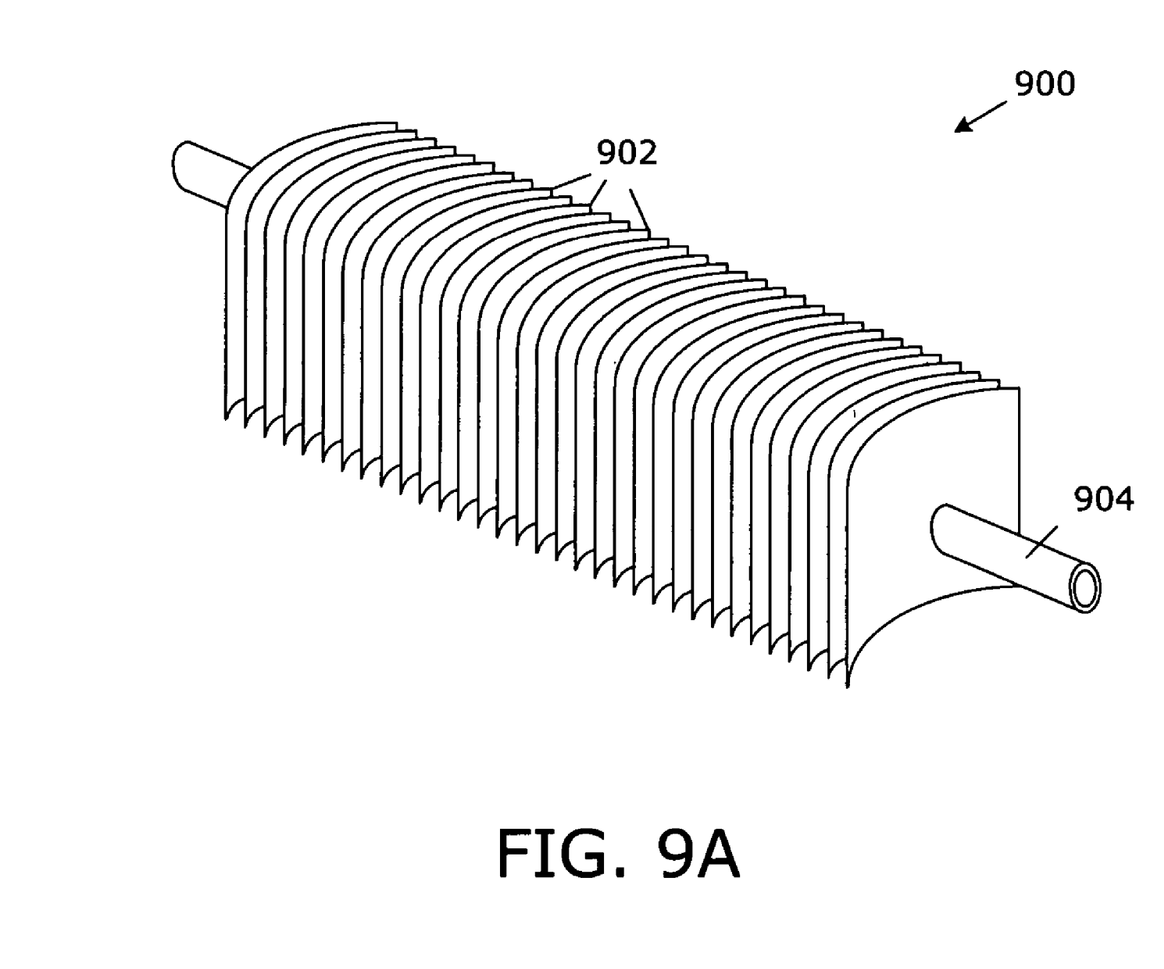
FIGS. 9A and 9B are pictorial diagrams illustrating embodiments of heat exchangers, which can benefit from fin curvature
Figure 9B:
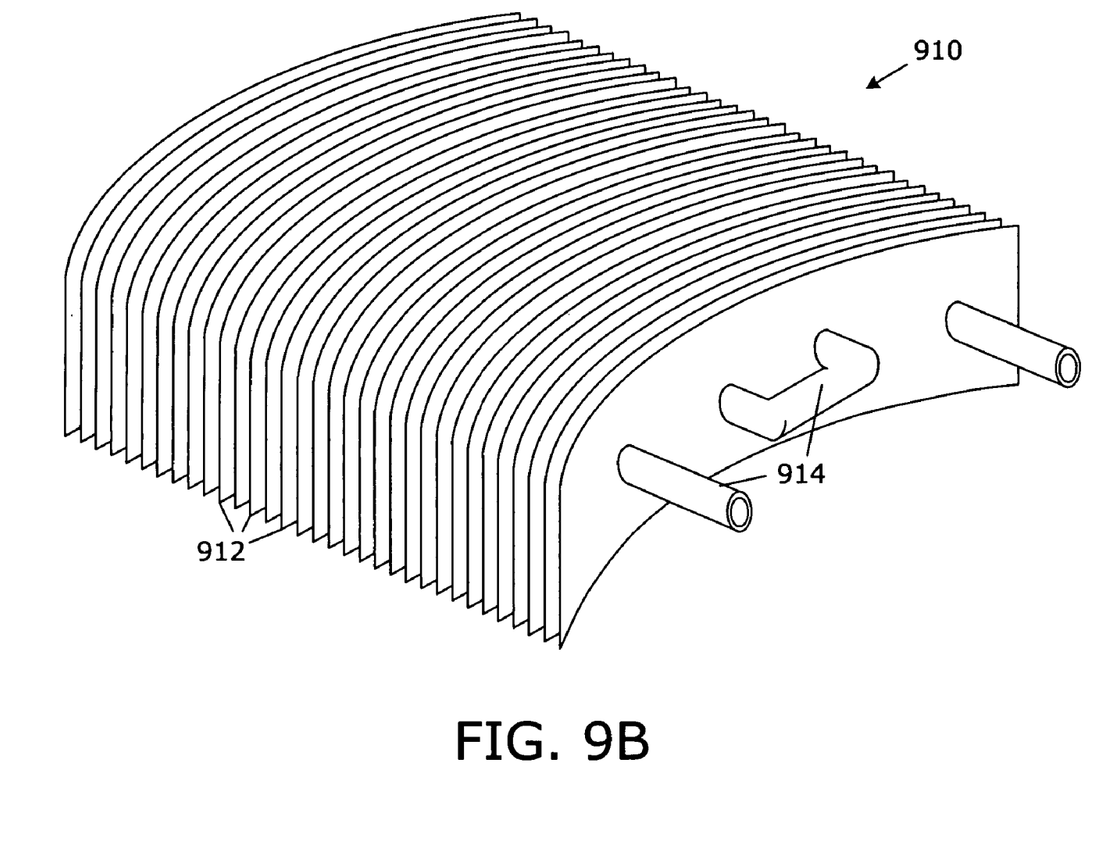

Referring to FIGS. 9A and 9B, two pictorial diagrams illustrate embodiments of heat exchangers 900 and 910, respectively, which can benefit from fin curvature. FIG. 9A depicts a single-pass liquid-to-air heat exchanger 900 constructed as a stack of closely-spaced plates or fins 902 attached to a tubing or tube segment 904 having a longitudinal axis and a circular cross-section. In some embodiments, the closely-stacked plates 902 may be arranged substantially perpendicular to the longitudinal axis of the tube segment 904. The single-pass heat exchanger 900 can be relatively long and thin for positioning within long and narrow spaces between components and devices within a chassis or housing. For example, the single-pass liquid-to-air heat exchanger 900 may be inserted in a space adjacent to one or more input/output devices.

FIG. 9B illustrates and example of a relatively short and flat multiple-pass heat exchanger 910 with a plurality of tubing segments 914 passing through a single stack of fins 912. The heat exchanger 910 may be used in a relatively wide and long, but low height space in a system. In other examples, the heat exchanger 910 may be positioned overlying a group of low-lying components, such as multiple components such as processors and memory, on a printed circuit card.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular geometries of the redundant fan and heat exchanger arrangements are shown, other arrangements are possible including additional multiple-pass arrangements in which additional fans, heat exchanger geometries, and heat exchanger segments are added. Also, particular electronic system embodiments are illustrated, for example a computer server. In other embodiments, the external heat exchanger can be employed in other types of electronic systems such as communication systems, storage systems, entertainment systems, and the like.

What is claimed is:

1. A heat exchanger comprising:
a tube; and
a plurality of fins coupled to the tube, the individual fins configured in curved planar surfaces that redirect a curved airflow received from a fan to a straightened vector in a direction axial to the fan.

2. The heat exchanger according to claim 1 further comprising:
an interior bore enclosed within the tube within which a cooling fluid can circulate, the tube configured in circulate the cooling fluid in a liquid loop cooling system.

3. The heat exchanger according to claim 1 wherein:
curvature of the curved planar surfaces of the fins has a form selected to accept and straighten a vector of air leaving an axial flow fan.

4. The heat exchanger according to claim 1 wherein:
curvature of the curved planar surfaces of the fins is configured with a double bend and curvature based on shape and size of fan impellers.

5. The heat exchanger according to claim 1 wherein:
the plurality of fins is arranged in a stack of mutually parallel, closely-spaced curved plates.

6. An assembly in a cooling system comprising:
a heat exchanger comprising a tube and a plurality of fins coupled to the tube defining airflow channels between adjacent fins; and
opposing fans coupled to and abutting opposite sides of the heat exchanger, the opposing fans generating an airflow direction aligned with the plurality of fins, wherein:
individual fins of the plurality of fins are configured in curved planar surfaces that redirect a curved airflow received from an upstream fan to a straightened vector in a direction axial to the upstream fan that improves performance of a downstream fan.

7. The assembly according to claim 6 further comprising:
an interior bore enclosed within the tube within which a cooling fluid can circulate, the tube configured to circulate the cooling fluid in a liquid loop cooling system.

8. The assembly according to claim 6 wherein:
curvature of the curved planar surfaces of the fins has a form selected to accept and straighten a vector of air leaving an axial flow fan.

9. The assembly according to claim 6 wherein:
thickness of the heat exchanger and separation of the opposing fans is selected to reduce acoustical noise.

10. The assembly according to claim 6 wherein:
the plurality of fins configured in curved planar surfaces that redirect a curved airflow received from an upstream fan of the opposing fans to a straightened vector in a direction axial to the opposing fans.

11. An assembly in a cooling system comprising:
a heat exchanger comprising a tube and a plurality of fins coupled to the tube defining airflow channels between adjacent fins; and
multiple pairs of opposing fans coupled to and abutting opposite sides of the heat exchanger, the opposing fans generating an airflow direction aligned with the plurality of fins.

12. An assembly in a cooling system comprising:
a heat exchanger comprising a tube and a plurality of fins coupled to the tube defining airflow channels between adjacent fins;
opposing fans coupled to and abutting opposite sides of the heat exchanger, the opposing fans generating an airflow direction aligned with the plurality of fins; and
opposing heat exchangers coupled to and abutting opposite sides of a downstream fan of the opposing fans, the opposing heat exchangers each having a plurality of fins, the individual fins having curved planar surfaces in a configuration that facilitates straightening of airflow through the downstream fan and to components downstream of the assembly.

13. A liquid loop cooling system comprising:
a tube enclosing an interior bore or lumen within which a cooling fluid can circulate, the tube configured to circulate the cooling fluid in the liquid loop cooling system;
a heat exchanger coupled to the tubing and comprising a tube and a plurality of fins coupled to the tube defining airflow channels between adjacent fins; and
multiple pairs of opposing fans coupled to and abutting opposite sides of the heat exchanger, the opposing fans generating an airflow direction aligned with the plurality of fins.

14. The system according to claim 13 wherein:
the plurality of the curved planar surfaces of fins has a curvature of a form selected to accept and straighten a vector of air leaving an axial flow fan.

15. The system according to claim 13 wherein:
thickness of the heat exchanger and separation of the opposing fans is selected to reduce acoustical noise.

16. The system according to claim 13 wherein:
the plurality of fins configured in curved planar surfaces that redirect a curved airflow received from an upstream fan of the opposing fans to a straightened vector in a direction axial to the opposing fans.

17. An electronic system comprising:
a chassis including airflow inlet and outlet vents;
a plurality of components including heat-generating components mounted within the chassis; and a liquid loop cooling system comprising:
- a tubing enclosing an interior bore or lumen within which a cooling fluid can circulate, the tube configured to circulate the cooling fluid in the liquid loop cooling system;
- a heat exchanger coupled to the tubing and comprising a tube and a plurality of fins coupled to the tube defining airflow channels between adjacent fins; and
- opposing fans coupled to and abutting opposite sides of the heat exchanger, the opposing fans generating an airflow direction aligned with the plurality of fins.

18. The system according to claim 17 wherein:
the heat exchanger separates the opposing fans by a distance selected to reduce acoustical noise.

19. The system according to claim 17 wherein:
the plurality of fins configured in curved planar surfaces that redirect a curved airflow received from an upstream fan of the opposing fans to a straightened vector in a direction axial to the opposing fans.

20. The system according to claim 17 further comprising:
multiple pairs of opposing fans coupled to and abutting opposite sides of the heat exchanger.

21. The system according to claim 17 further comprising:
opposing heat exchangers coupled to and abutting opposite sides of a downstream fan of the opposing fans, the opposing heat exchangers each having a plurality of fins, the individual tins having curved planar surfaces in a configuration that facilitates straightening of airflow through the downstream fan and to components downstream of the assembly.

22. A method for directing airflow through a heat exchanger comprising:
- determining a spatial vector distribution of airflow produced by an axial flow fan;
- deriving a curved planar fin plate shape and configuration for a plurality of heat exchanger fins based on the spatial vector distribution that straightens the airflow from the fan;
- arranging the plurality of heat exchanger fins on a heat exchanger; and
- connecting opposing axial flow fans abutting opposite sides of the heat exchanger.

23. The method according to claim 22 further comprising:
connecting a downstream heat exchanger abutting a downstream side of a downstream axial flow fan of the opposing axial flow fans.

* * * * *

UNITED STATES PATENT AND TRADEMARK OFFICE
CERTIFICATE OF CORRECTION

PATENT NO. : 7,142,424 B2  Page 1 of 1
APPLICATION NO. : 10/835852
DATED : November 28, 2006
INVENTOR(S) : Christopher G. Malone et al.

It is certified that error appears in the above-identified patent and that said Letters Patent is hereby corrected as shown below:

In column 3, line 7, delete "modem" and insert -- modern --, therefor.

In column 7, line 41, in Claim 2, delete "in" and insert -- to --, therefor.

In column 8, line 41, in Claim 13, delete "tube" and insert -- tubing --, therefor.

In column 10, line 2, in Claim 21, delete "tins" and insert -- fins --, therefor.

Signed and Sealed this

Twenty-second Day of December, 2009

David J. Kappos
*Director of the United States Patent and Trademark Office*